United States Patent [19]

Saito et al.

[11] Patent Number: 5,041,732
[45] Date of Patent: Aug. 20, 1991

[54] CHARGED PARTICLE BEAM GENERATING APPARATUS

[75] Inventors: Kenichi Saito; Hirofumi Morita, both of Isehara; Nobuo Shimazu, Machida, all of Japan

[73] Assignee: Nippon Telegraph and Telephone Corporation, Tokyo, Japan

[21] Appl. No.: 482,543

[22] Filed: Feb. 21, 1990

[30] Foreign Application Priority Data

Feb. 22, 1989 [JP] Japan .................................. 1-40353
Feb. 14, 1990 [JP] Japan .................................. 2-31609

[51] Int. Cl.$^5$ ............................................ H01J 37/141
[52] U.S. Cl. ..................... 250/396 ML; 250/423 F; 313/361.1
[58] Field of Search ........ 250/396 R, 396 ML, 423 F; 313/361.1, 336

[56] References Cited

U.S. PATENT DOCUMENTS

| | | | |
|---|---|---|---|
| 3,144,627 | 8/1964 | Dannabeck | 336/55 |
| 3,870,891 | 3/1975 | Mulvey | 250/396 ML |
| 4,315,152 | 2/1982 | Smith | 250/396 ML |
| 4,544,845 | 10/1985 | Michel | 250/423 F |
| 4,725,736 | 2/1988 | Crewe | 250/396 ML |

FOREIGN PATENT DOCUMENTS 84568 7/1976 Japan .
60-127645 7/1985 Japan .

OTHER PUBLICATIONS

A. Delong et al., "A New Deisgn of Field Emission Electron Gun with a Magnetic Lens", OPTIK, vol. 81, No. 3, Feb. 1989, pp. 103–108.
M. Troyon, "High Current Efficiency Field Emission Gun System Incorporating a Preaccelerator Magnetic Lens", OPTIK 57, No. 3 (1980), pp. 401–419.
D. W. Tuggle et al., "Emission Characteristics of the ZrO/W Thermal Field Electron Source", Journal of Vacuum Science and Technology, No. 1 (1985), pp. 220–223.

Primary Examiner—Bruce C. Anderson
Attorney, Agent, or Firm—Spencer & Frank

[57] ABSTRACT

In a charged particle beam generating apparatus, the emitter is so arranged that its distal end is disposed at a level below a peak of a distribution of a magnetic flux density. An inner diameter of a lower portion of a pole piece is smaller than an inner diameter of an upper portion of the pole piece. The peak of the magnetic flux density is disposed close to the lower end of the pole piece, and at the same time the magnetic field is prevented from extending downwardly beyond the lower end of the pole piece.

14 Claims, 14 Drawing Sheets

PRIOR ART

CHARGED PARTICLE BEAM GENERATING APPARATUS

BACKGROUND OF THE INVENTION

1. Field of the Invention

The present invention relates to a charged particle beam generating apparatus adapted to be incorporated in an electron beam exposure apparatus, an electron microscope, an ion beam exposure apparatus or the like, and particularly best suited for use in an electron gun of the field emission type or the thermal field emission type. More specifically, the invention relates to such a charged particle beam generating apparatus which can increase an effective beam emission angle without lowering the brightness, and can enhance the efficiency of use of the beam current.

2. Description of the Prior Art

In an electron beam exposure apparatus for describing or extracting fine patterns in the fabrication of an LSI, it has been required to improve the brightness of an electron gun in order to improve a description resolution and a description speed. In an electron microscope, it has also been required to improve the brightness of an electron gun in order to improve an observation resolution.

The brightness B of an electron gun is expressed in the following:

$$B = I'/r^2 \tag{1}$$

$$r = [r_o^2 + (0.25\, C_{ss}^3)^2 + (0.5 C_{cs}\, \Delta V/Va)^2 + (0.6\lambda/s)^2]^{\frac{1}{2}} \tag{2}$$

where $I'$ represents an angular intensity (electric current per unit solid angle) of the beam emitted from an emitter, r represents the radius of a beam emitting source obtained when taking aberrations into consideration, s represents an emission angle (beam half angle), $r_o$ represents the radius of the beam emitting source obtained when disregarding the aberrations, Cs represents a spherical aberration coefficient (referred to the object side) of the electron gun, Cc represents a chromatic aberration coefficient (referred to the object side) of the electron gun, $\Delta V$ represents a beam energy spread, Va represents a beam accelerating voltage, and $\lambda$ represents a wavelength of the electrons at the accelerating voltage Va.

From the formulas (1) and (2), it will be appreciated that in order to enhance the brightness B, it is necessary (1) to reduce the radius $r_o$ of the beam emitting source obtained when the aberrations are disregarded and (2) to reduce the spherical aberration coefficient Cs and the chromatic aberration coefficient Cc. For this reason, an electron gun, incorporating an emitter of the field emission type having a pointed distal end, an emitter of the thermal field emission type and a magnetic lens having small aberration coefficients, has now begun to be used as an electron beam generating apparatus.

As a first example of conventional charged particle beam generating apparatuses, there is shown in FIG. 1 "a high current efficiency field emission gun system incorporating a preaccelerator magnetic lens" of M. Troyon described in Optik 57, No. 3 (1980) p. 401. The electron gun is accomodated within a column 1 having an evacuation port 2 through which the interior of the column 1 can be evacuated to a high vacuum by a vacuum system (not shown). The electron gun comprises an emitter 3 made of a tungsten tip having a pointed distal end, a magnetic lens 4 composed of a first anode 5, a coil 6 and a pole piece 7, and a second anode 8. In this conventional structure, the inner surface of the column 1 is covered by a magnetic shield 9.

When a required voltage $-Va$ (negative) is applied to the emitter 3 whereas a voltage $-Va + Vo$ (hereinafter referred to as "extraction voltage Vo") is applied to the first anode 5 and the pole piece 7, an electron beam 10 is field-emitted from the distal end of the emitter 3. The second anode 8 is grounded, and the potential difference Va between the second anode 8 and the emitter 3 serves as a beam accelerating voltage. The first anode 5 and the pole piece 7 are both made of a magnetic material, and when electric current NI is caused to flow through the coil 6, a focusing magnetic field is created between the first anode 5 and the pole piece 7. The electron beam 10 is focused or converged by this focusing magnetic field on a point intermediate the pole piece 7 and the second anode 8. When the accelerating voltage Va, the extraction voltage Vo and the coil current NI are 90 kV, 1.85 kV and 380 AT, respectively, the spherical aberration coefficient Cs of this conventional electron gun is 2 mm, and its chromatic aberration coefficient Cc is 1.3 mm. These values are almost the lower limits of the aberration coefficients of field-emission type electron guns now available.

The positional relation between the pole piece and the emitter in the above first example of the field-emission type electron gun incorporating the magnetic lens is diagrammatically shown in FIG. 2 together with a distribution of the magnetic flux density on the optical axis. Reference numeral 11 denotes a principal plane of the lens defined by the pole piece 7 and the coil 6, and a curve 13 represents the magnetic flux density on the optical axis 12. In this conventional electron gun, the inner diameter of the pole piece 7 is uniform from its upper to its lower end, and the emitter 3 is disposed at a level above a space or gap between the opposed end surfaces 7A and 7B of the pole piece 7, that is, above the upper end surface 7A. In such a conventional electron gun, the magnetic flux density is the maximum at the center of the gap, and the distribution of the magnetic flux density is symmetrical. In such a construction, the principal plane 11 of the lens is disposed generally at the center of the gap, and the electron beam 10 is focused as shown in FIG. 2.

Generally, in an electron gun, the spherical aberration coefficient referred to the object side becomes smaller as the distance a between the distal end of the emitter and the lens principal plane becomes smaller. In the electron gun of FIG. 2, the spherical aberration coefficient Cs becomes smaller as the distance a becomes smaller. However, in the electron gun of FIG. 2, the emitter 3 is disposed at a level above the end surface 7A of the pole piece 7, and therefore the distance a could only be reduced to about a half of the length b of the gap at best. As a result, the reduction of the spherical aberration coefficient has been limited.

Next, as a second example of conventional charged particle beam generating apparatuses of the field emission type incorporating a magnetic lens, there is shown in FIG. 3 a field-emission type electron gun disclosed in Japanese Patent Application Laid-Open No. 84568/76. FIG. 4 shows a path of travel of an electron beam in this conventional electron gun. Those parts of FIGS. 3 and 4 corresponding respectively to those of FIGS. 1 and 2 are designated by identical and like reference numerals.

In FIG. 3, reference numerals 7a and 7b denote pole pieces, and reference numeral 14a denotes a extracting electrode, and reference numeral 14b denotes an anode. The extracting electrode 14a and the anode 14b constitute an electrostatic lens. In FIG. 4, reference numeral 11a denotes a principal plane of a magnetic lens. In the case where an emitter 3 is disposed at a level above the peak of a magnetic flux density distribution 13, the principal plane 11a is formed generally at the peak of the magnetic flux density distribution 13. Reference numeral 11b denotes a principal plane of the electrostatic lens. Reference numeral 11c denotes a lens principal plane synthesized by the magnetic lens and the electrostatic lens. The electron beam 10 emitted from the emitter 3 in a radiating manner is caused by the focusing action of the magnetic lens to advance parallel with the optical axis 12, and is directed to an aperture of the extracting electrode 14a. The electron beam 10 passed through the extracting electrode 14a is focused by the focusing action of the electrostatic lens on a focusing point 10a. In this conventional electron gun, the magnetic field in the vicinity of the emitter 3 controls the radially-spreading electron beam, so that most part of the emission current can be directed to the electrostatic lens.

As shown in FIG. 4, in the second example of the conventional charged particle beam generating apparatus, the magnetic lens performs the function of making the radially-emitting electron beam 10 parallel to the optical axis 12, and the electrostatic lens performs the function of focusing the electron beam 10. Therefore, the lens principal plane 11c synthesized by the magnetic lens and the electrostatic lens is disposed generally midway between the principal plane 11a of the magnetic lens and the principal plane 11b of the electrostatic lens. On the other hand, the emitter 3 is disposed at a level above the peak of the magnetic flux density distribution 13 (that is, above the principal plane 11a). Therefore, the distance a between the emitter 3 and the principal plane 11c can only be reduced to about a half of the distance between the principal plane 11a and the principal plane 11b at best. As mentioned above, generally, the spherical aberration coefficient referred to the object side becomes smaller as the distance a between the emitter 3 and the lens principal plane 11c becomes smaller. However, in this second example of the conventional charged particle beam generating apparatus, the function of focusing the beam is performed by the combination of the magnetic lens and the electrostatic lens (this function is performed mainly by the electrostatic lens). Also, the emitter 3 is disposed at the foot of the magnetic flux density distribution disposed above its peak. Therefore the distance a between the emitter 3 and the lens principal plane 11c can not be reduced, which results in a problem that the spherical aberration can not be reduced as is the case with the above first example of the prior art.

Further, as a third example of conventional charged particle beam generating apparatuses, there is shown in FIG. 5 an electron beam apparatus of Kenneth C. A. Smith disclosed in U. S. Pat. No. 4,315,152. FIG. 6 shows a path of travel of an electron beam in this conventional structure. Those parts of FIGS. 5 and 6 corresponding respectively to those of FIGS. 1 to 4 are designated by identical and like reference numerals. In this conventional electron beam apparatus, an electrostatic lens, constituted by a extracting electrode 14a and two anodes 14b, is provided below and adjacent to an emitter 3. Provided below this electrostatic lens is a magnetic lens having a coil 6 and a pole piece 7 of the monopole type. In this construction, a principal plane 11 of the magnetic lens is disposed generally at a level of the upper end surface of the pole piece 7 of the mono-pole type, and the upper portion of the magnetic flux density distribution above its peak has a gently slanting configuration, and its foot end is disposed slightly above the emitter 3. Thus, in this conventional electron beam apparatus, the emitter is disposed at the foot portion of the gently slanting portion of the magnetic flux density distribution disposed above its peak. This results from the fact that the extracting electrode 14a (electrostatic lens) is disposed between the emitter 3 and the pole piece 7, and with this construction, the distance a between the emitter 3 and the lens principal plane 11 is long.

In the above-mentioned charged particle beam generating apparatuses, when the emitter 3 is made of a zirconium/tungsten thermal field-emission type tip, the following problems are encountered. Namely as described in "Emission characteristics of the ZrO/W thermal field electron source" (D. W. Tuggle and L. W. Swanson) in Journal of Vacuum Science And Technology, B3, No. 1 (1985), page 220, good characteristics of electron emission, in which the angular intensity is generally uniform, can be obtained at an emission angle s of not more than −35 mrad. However, in the conventional charged particle beam generating apparatuses, the spherical aberration coefficient Cs is large, and therefore when the electron gun is used at regions where the emission angle s is large, the brightness B of the electron gun has been greatly reduced. For example, in the first example of the conventional charged particle beam generating apparatus of FIG. 1, when a zirconium/tungsten thermal-field-emission type tip is used, the values determined by the formulas (1) and (2) are reduced to one-fifth (1,/5) where the electron beam accelerating voltage Va is 30 kV, the beam energy spread $\Delta V$ is 0.8 eV, the angular intensity I′ is 0.5 mA/sr, the radius $r_o$ of the beam emitting source obtained when disregarding the aberrations is 0.01 $\mu$m, the spherical aberration coefficient Cs is 2 mm, and the chromatic aberration coefficient Cc is 1.3 mm. Therefore, in the aforesaid conventional charged particle beam generating apparatuses, the beam emission angle s is limited to not more than 15 mrad, which results in a problem that the beam current usable by a zirconium/tungsten thermal-field-emission type tip can not be fully utilized.

SUMMARY OF THE INVENTION

With the above deficiencies of the prior art in view, it is an object of this invention to provide a charged particle beam generating apparatus in which the aberration coefficients are small, and the brightness is high even at a large emission angle.

According to the present invention, there is provided a charged particle beam generating apparatus comprising:

an emitter for emitting a beam of charged particles, and a magnetic lens including a coil, and a pole piece constituting a magnetic path;

a distal end of the emitter being disposed at a level below a peak of a distribution of a magnetic flux density formed by the magnetic lens.

More specifically, the emitter is disposed close to a lower end surface of the pole piece which also has an upper end surface.

Further, in the present invention, the coil is annular, and there is provided a holder member for holding the emitter. An inner diameter of an upper portion of the pole piece is greater than the holder member, and an inner diameter of a lower portion of the pole piece is smaller than the inner diameter of the upper portion of said pole piece.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Preferred embodiments of the present invention will now be described with reference to the drawings, but before doing so, the principles of the present invention will first be described with reference to FIGS. 7 and 8.

Figure 2:
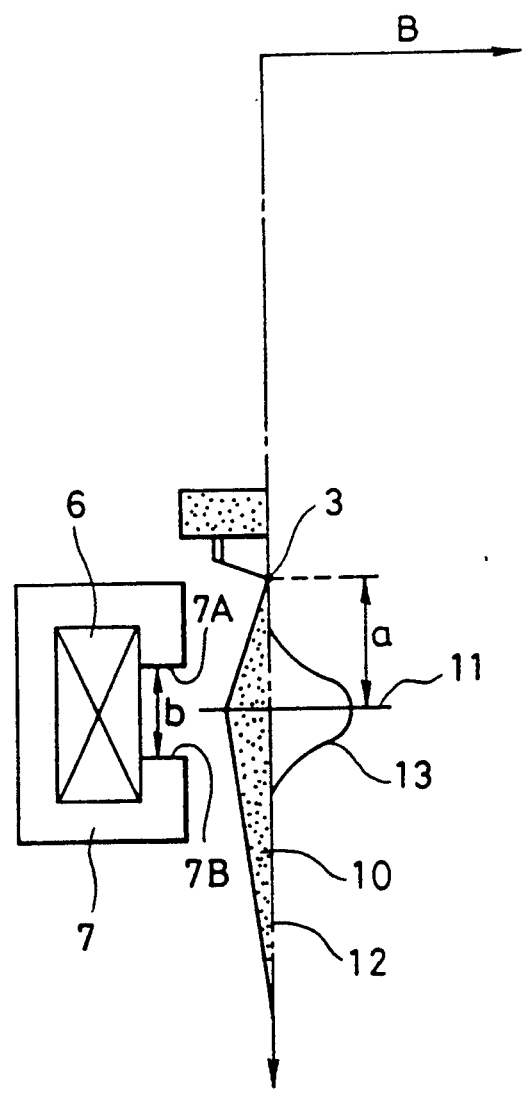
FIG. 2 is an diagrammatical illustration showing a magnetic flux density on the optical axis of the conventional apparatus of FIG. 1 as well as the arrangement of an emitter.
Figure 3:
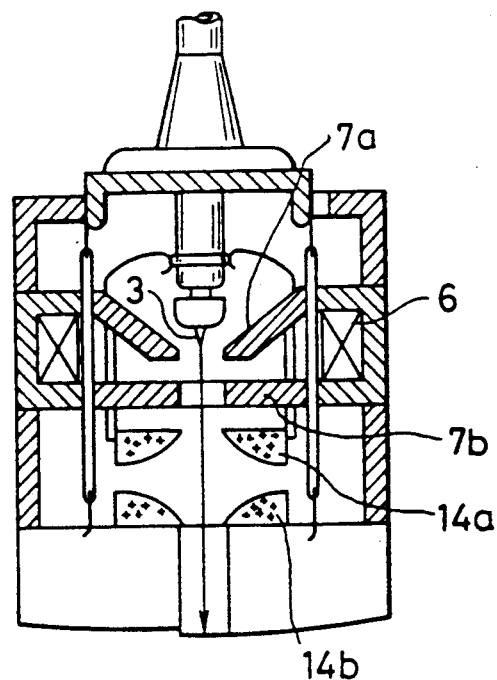
FIG. 3 is a cross-sectional view of a second example of a conventional charged particle beam generating apparatus.
Figure 4:
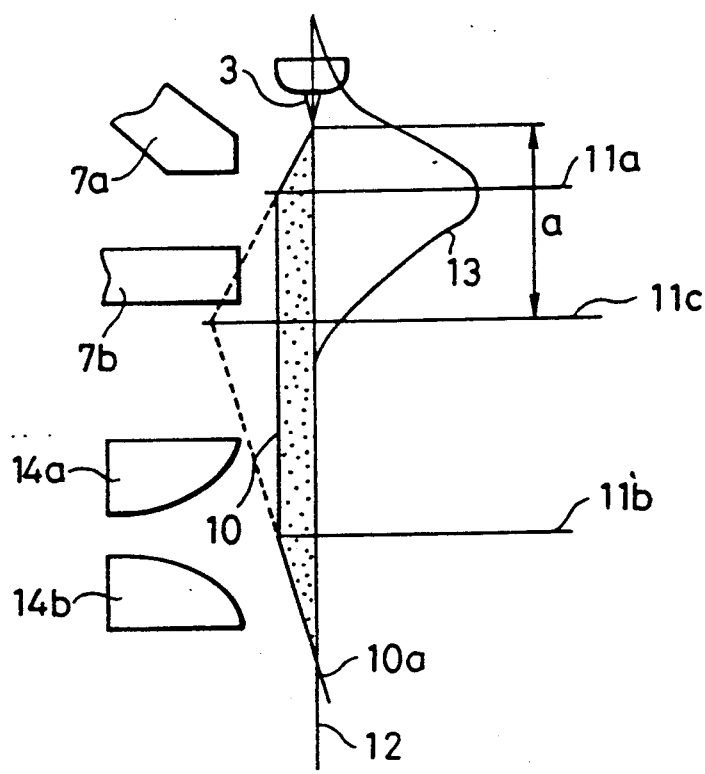
FIG. 4 is a diagrammatical illustration showing a magnetic flux density on the optical axis of the conventional apparatus of FIG. 3 as well as the arrangement of an emitter.
Figure 5:
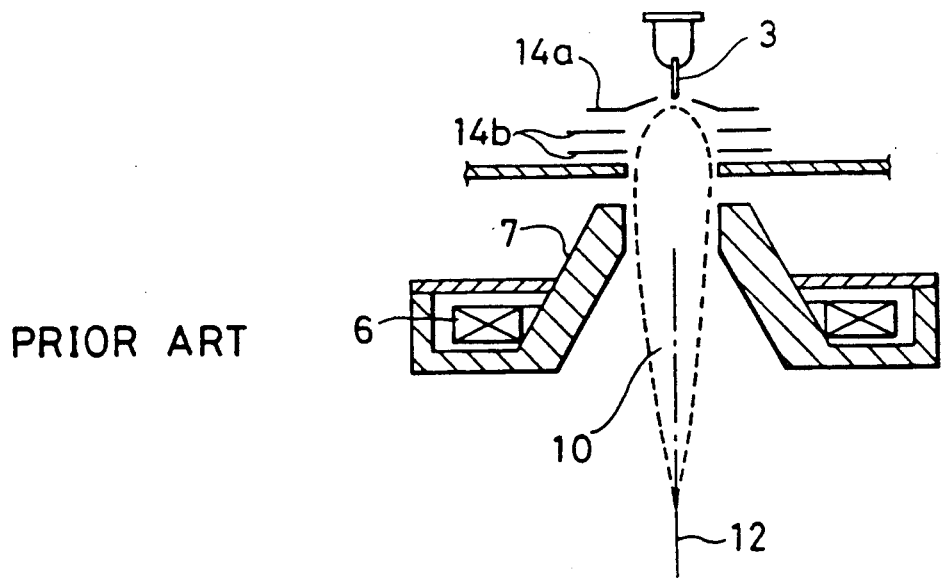
FIG. 5 is a cross-sectional view of a third example of a conventional charged particle beam generating apparatus.
Figure 6:
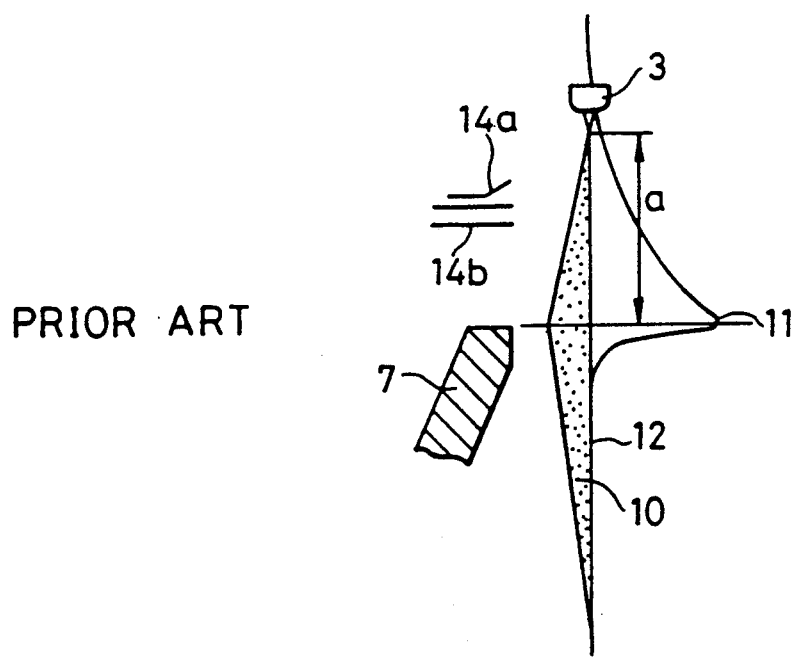
FIG. 6 is a diagrammatical illustration showing a magnetic flux density on the optical axis of the conventional apparatus of FIG. 5 as well as the arrangement of an emitter.
Figure 7:
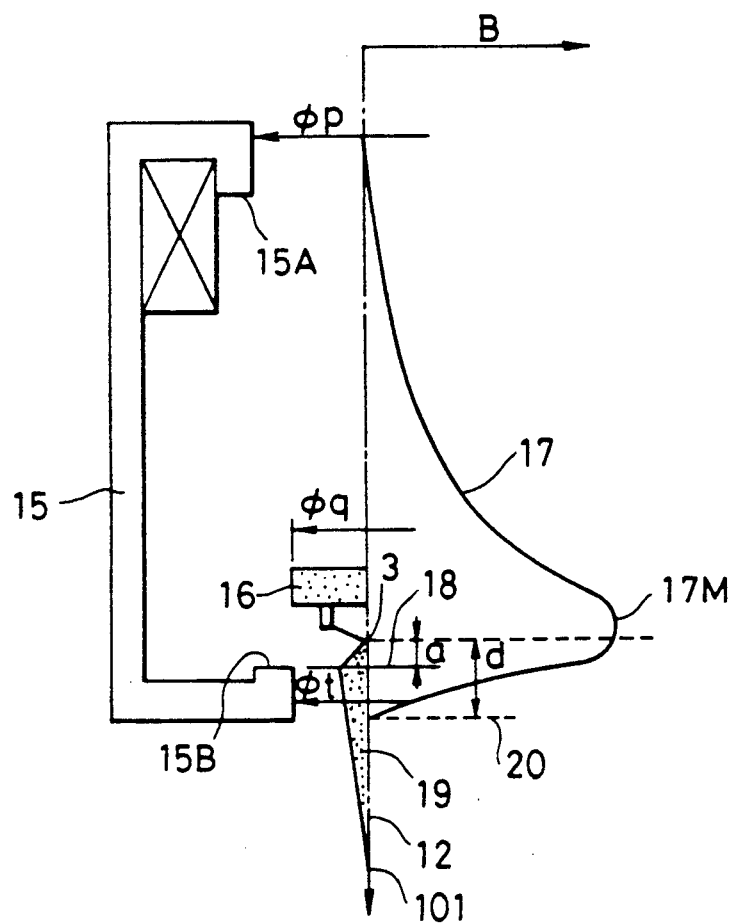
FIG. 7 is a diagrammatical illustration showing a magnetic flux density on the optical axis of a charged particle beam generating apparatus of the present invention as well as the arrangement of an emitter.

FIG. 7 diagrammatically shows the positional relation between a pole piece and an emitter of an apparatus according to the present invention, as well as a magnetic flux density distribution on the optical axis. An inner diameter p of an upper portion of the pole piece 15 is greater than an outer diameter q of a holder portion 16 for the emitter 3, and the emitter 3 is disposed in a gap (i.e., a space between end surfaces 15A and 15B) formed by the pole piece 15, and more specifically is disposed close to the end surface 15B. An inner diameter t of the lower portion of the pole piece 15 is smaller than the inner diameter p of the upper portion of the pole piece 15 so that the maximum peak 17M of the magnetic flux density 17 is disposed in the gap formed by the pole piece 17 and is disposed close to the end surface 15B. The distal end of the emitter 3 is disposed below the maximum peak 17M of the magnetic flux density 17. In this condition, when electric current flowing through a coil 6 is greatly increased as compared with that used in FIG. 2 so as to increase the magnetic flux density 17, a lens principal plane 18 is formed immediately below the emitter 3. An electron beam 19 is focused as shown in FIG. 7. The distance a between the distal end of the emitter 3 and the principal plane 18 can be reduced limitlessly by reducing the distance d between the distal end; of the emitter 3 and a surface 20 (which is disposed at the lower surface of the pole piece 15) where the magnetic flux density 17 is zero and by increasing the magnetic flux density 17.

Thus, in the present invention, the peak 17M of the magnetic flux density distribution (which has conventionally been formed generally midway of the gap of the pole piece) is disposed as close to the lower end of the gap (i.e., the space between the end surfaces 15A and 15B) as possible, and at the same time the magnetic field is prevented as much as possible from extending downwardly beyond the lower end surface 15B of the pole piece 15. Namely, the magnetic flux density is arranged to be abruptly reduced in the vicinity of the lower end surface 15B. FIG. 8 shows the calculation results of a spherical aberration coefficient Cs, a chromatic aberration coefficient Cc and a peak value Bm of the magnetic flux density, obtained when the emitter 3 was disposed at various positions with respect to this magnetic flux density distribution. The magnetic flux density shown in FIG. 9 was used for the calculation, and Bm was so determined that a focusing point 101 of the beam 19 was disposed at a point spaced 100 mm from the peak 17M of the magnetic flux density. As the distal end of the emitter 3 is moved or displaced downward toward the lower end of the magnetic flux density distribution (i.e., Ze increases), the spherical aberration coefficient Cs and the chromatic aberration coefficient Cc are reduced, and it becomes necessary to increase the peak value Bm.

The reason that the aberration coefficients decreases with the downward movement of the emitter is as follows. When the distal end of the emitter 3 is disposed above the peak 17M of the magnetic flux density, the principal plane 18 of the magnetic lens is formed in the vicinity of the peak 17M of the magnetic flux density. Therefore, as the distal end of the emitter 3 is moved downward toward the lower end of the magnetic flux density distribution, the distance a between the distal end of the emitter 3 and the lens principal plane 18 becomes smaller, and the aberration coefficients become smaller. When the distal end of the emitter 3 is disposed below the peak 17M, the lens principal plane 18 is formed intermediate the distal end of the emitter 3 and the plane 20 where the magnetic flux density is zero, as shown in FIG. 7. When the distal end of the emitter 3 is moved downward, the distance d between the distal end of the emitter 3 and the plane 20 becomes smaller. Since the distance a between the distal end of the emitter 3 and the principal plane 18 is smaller than the distance d, the distance a decreases with the downward movement of the emitter 3, and the aberration coefficients are reduced.

The reason that the peak value Bm of the magnetic flux density need be increased with the downward movement of the emitter 3 is as follows. The electron beam 19 emitted from the emitter 3 is subjected to a converging or focusing force, resulting from the magnetic flux density 17, at the region from the distal end of the emitter 3 to the plane 20, so that the electron beam 19 is focused on the point 101. As the emitter 3 is moved downward, the distance d over which the electron beam 19 is subjected to the focusing force becomes shorter. Therefore, in order to focus the beam on the same point 101, it is necessary to apply a strong focusing force to the beam. Accordingly, the necessity for increasing the peak value Bm of the magnetic flux density arises.

Figure 8:
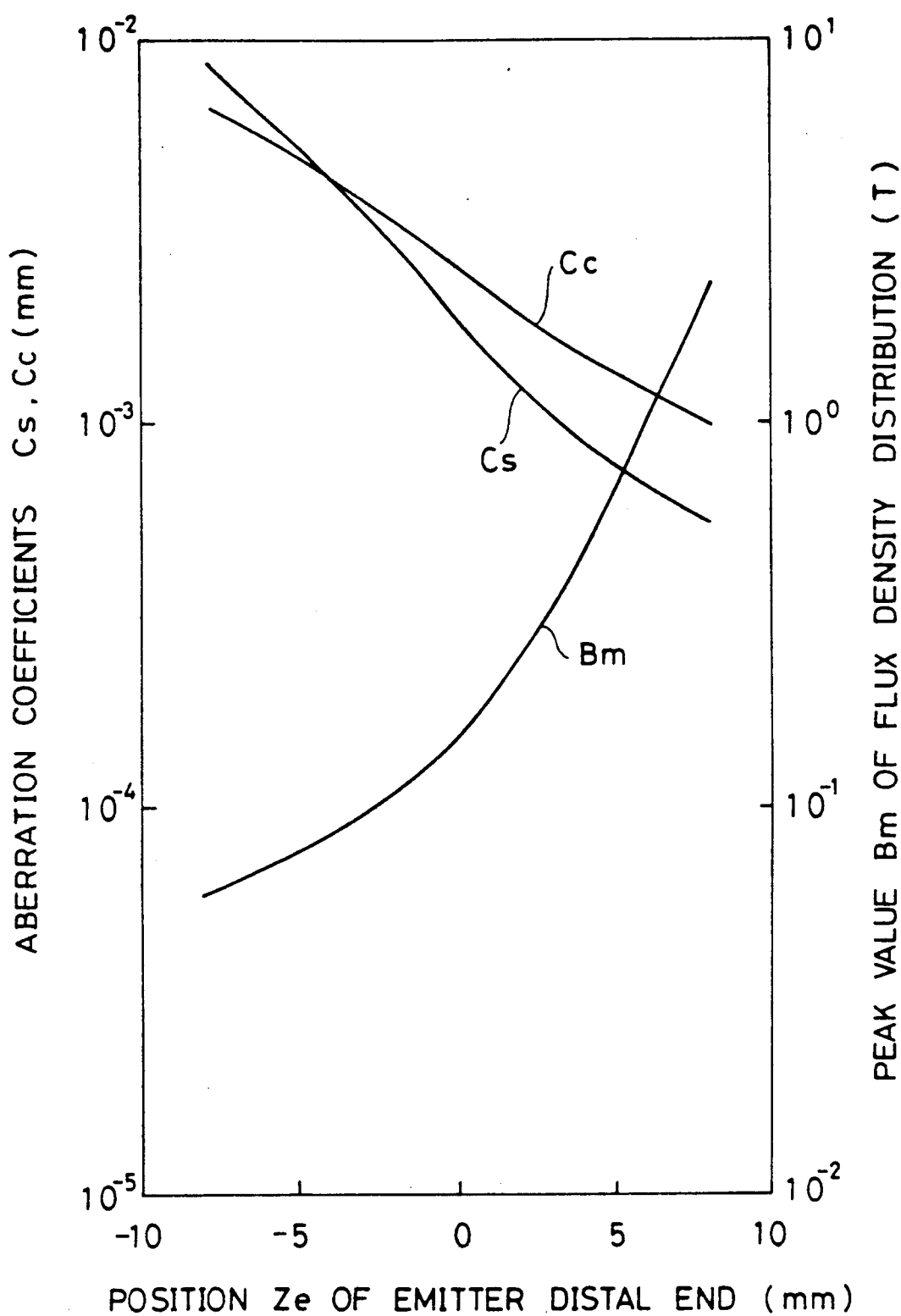
FIG. 8 is an illustration explanatory of the present invention, and showing calculation results of a spherical aberration coefficient Cs, a chromatic aberration coefficient Cc and a peak value Bm of the magnetic flux density, obtained when the emitter is positioned at various positions with respect to the distribution of the magnetic flux density.
Figure 9:
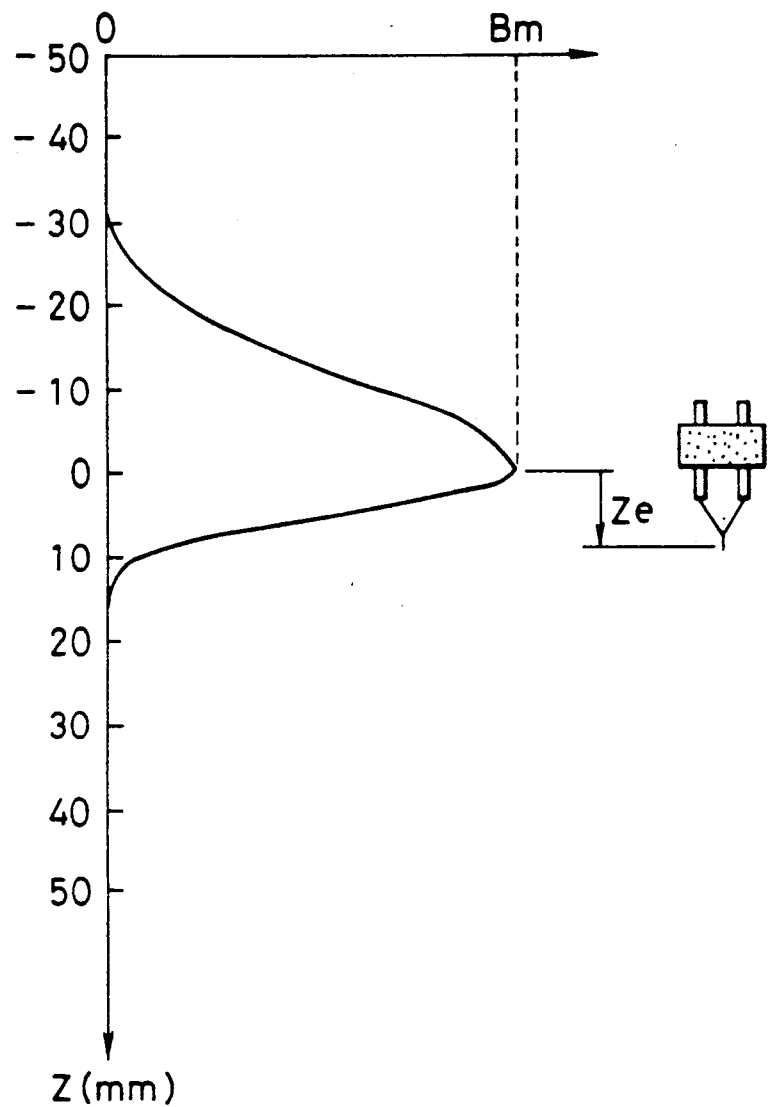
FIG. 9 is a diagrammatical illustration showing the distribution of the magnetic flux density used when calculating the above spherical aberration coefficient Cs and chromatic aberration coefficient Cc.

It will be appreciated from FIG. 8 that the aberration coefficients can be reduced by moving the distal end of the emitter 3 downward. However, at this time, it is necessary to increase the coil current to increase the peak value Bm of the magnetic flux density. In the conventional electron guns, the peak value Bm of the magnetic flux density could only be set to about $10^{-2}$ T or less because of the heating of the coil due to the increased current, and therefore the distal end of the emitter 3 must be disposed above the peak of the magnetic flux density. In the present invention, the coil is made of a copper pipe, and cooling water is caused to flow through the pipe, thereby preventing a temperature rise of the coil. As a result, it becomes possible to flow a large current through the coil, so that the peak value Bm can be increased to 0.5 T. With this construction, the distal end of the emitter 3 can be disposed 4 mm below the peak 17M of the magnetic flux density distribution, and the aberration coefficients can be greatly reduced as compared with those of the prior art.

In the present invention, as described above, the peak of the magnetic flux density distribution is moved toward the lower end of the gap of the pole piece as much as possible, and at the same time the magnetic field is prevented as much as possible from extending downwardly beyond the lower end surface of the pole piece 15, as shown in FIG. 7. The reason for this is to shorten the distances d and a so as to reduce the aberration coefficients.

PREFERRED EMBODIMENTS

Figure 10:
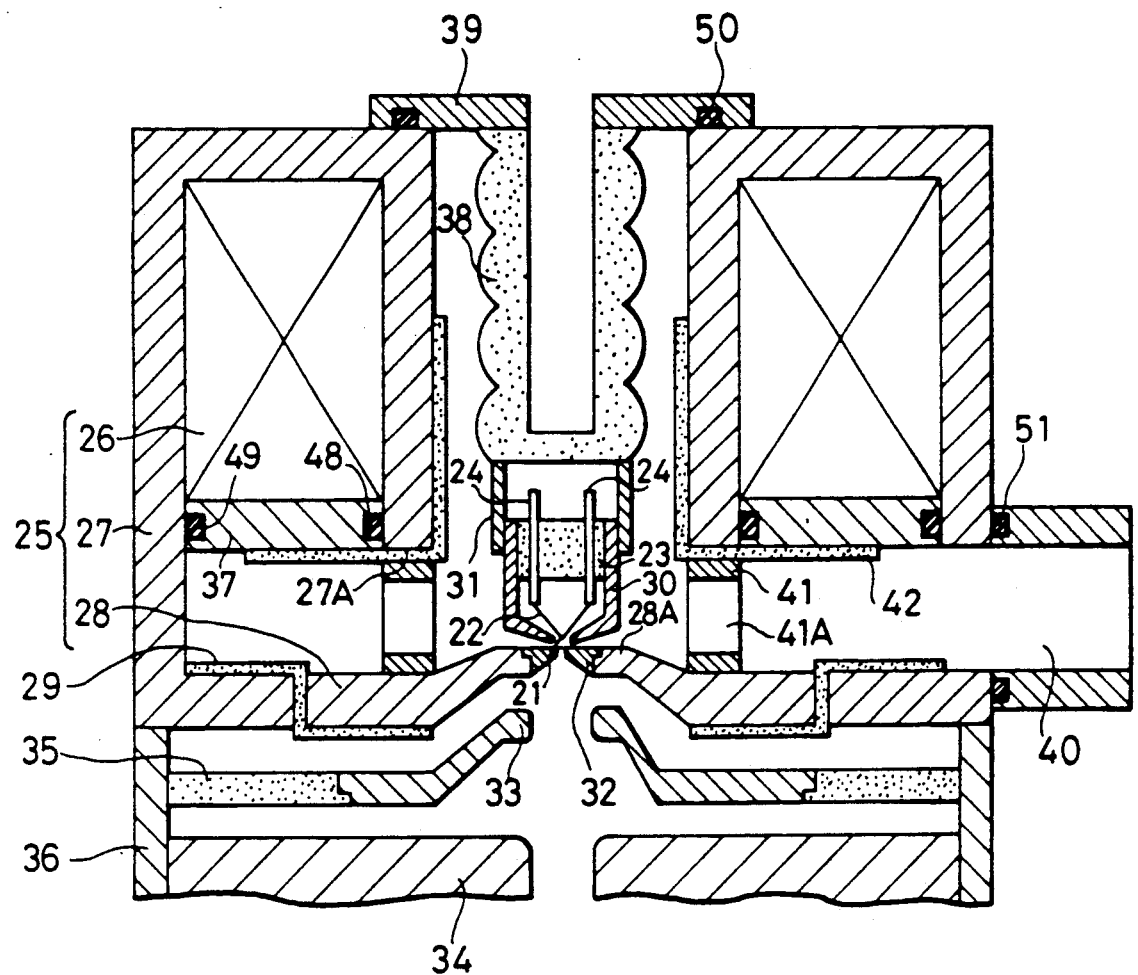
FIG. 10 is a cross-sectional view of a charged particle beam generating apparatus provided in accordance with the present invention.
Figure 11:
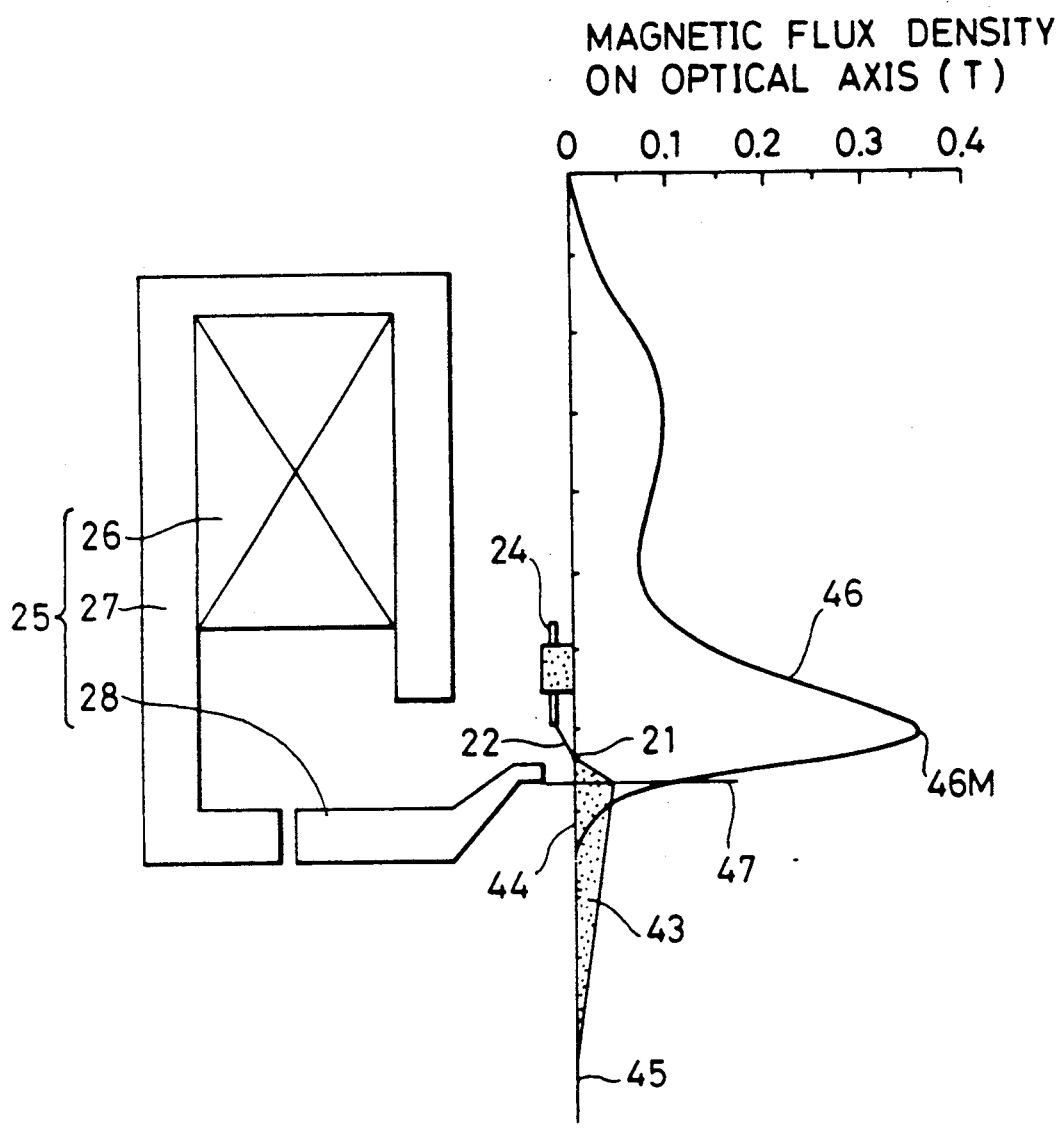
FIG. 11 is a diagrammatical illustration explanatory of the present invention, and showing the distribution of the magnetic flux density as well as the arrangement of the emitter.

FIG. 10 shows one preferred embodiment of an electron gun embodying the present invention. In this embodiment, a zirconium/tungsten thermal-field-emission type tip is used as an emitter 21. The emitter 21 is mounted on a distal end of a filament 22, and the filament 22 is connected to terminal electrodes 24 extending through an insulator 23. A voltage is applied to the emitter 21 through the electrodes 24. A magnetic lens 25 comprises an annular coil 26, a first pole piece 27 enclosing the coil 26 and constituting a magnetic path, and a second pole piece 28 electrically insulated from the first pole piece 27 but magnetically connected thereto to form a magnetic path. The first and second pole pieces are made of a magnetic material such as pure iron. The inner diameter of the first pole piece 27 is greater than the outer diameter of a holder plate 31 for a suppresser electrode 30, and the emitter 21 and the suppresser electrode 30 are received within the magnetic lens 25. A magnetic field is produced between a lower end surface 27A of the first pole piece 27 and an upper end surface 28A of the second pole piece 28 which cooperate with each other to form a magnetic circuit. The emitter 21 is disposed at a level between the two end surfaces 27A and 28A. The inner diameter of the second pole piece 28 is smaller than the inner diameter of the first pole piece 27 so that the maximum peak 46M of the magnetic flux density is disposed close to the emitter 21, the distal end of the emitter 21 being disposed below the peak 46M of the magnetic flux density, as shown in FIG. 11.

Thus, in the present invention, the inner diameter of the lower portion of the pole piece structure (i.e., the inner diameter of the second pole piece 28) is smaller than the inner diameter of the upper portion of the pole piece structure (i.e., the inner diameter of the first pole piece) With this construction, the peak of the magnetic flux density distribution is disposed close to the lower end portion of the pole piece structure (i.e., the upper end surface 28A of the second pole piece 28), and at the same time the magnetic field is prevented from extending downwardly beyond the pole piece structure.

The suppresser electrode 30 is mounted on the insulator 23 in surrounding relation to the emitter 21, and is held by the holder plate 31. A extracting electrode 32 having a central narrow hole is fastened to the central portion of the second pole piece 28 by suitable means such as a threaded connection arrangement and an adhesive. A lens electrode 33 having a central hole is disposed below the extracting electrode 32, and an earth electrode 34 having a central hole is disposed below the lens electrode 33. The lens electrode 33 is supported on an outer wall 36 of a column through an insulator 35. The earth electrode 34 may be supported directly on the outer wall 36. The suppresser electrode 30, the holder plate 31, the extracting electrode 32, the lens electrode 33 and the earth electrode 34 are all made of a non-magnetic material such as titanium.

The lower surface of the coil 26 is covered by a vacuum seal plate 37 made of a non-magnetic material such as titanium. The holder plate 31 for the suppresser electrode 30 is supported on a top plate 39 through an insulator 38. Therefore, the first pole piece 27, the second pole piece 28, the vacuum seal plate 37, the insulator 38 and the top plate 39 jointly form a vacuum chamber. This vacuum chamber can be evacuated to a high vacuum by a vacuum system (not shown) through an evacuation port 40. Thus, in this embodiment, the vacuum chamber containing the emitter and the magnetic lens therein is mounted on the top of the outer wall 36 of the column. A support member 41 made of a non-magnetic material such as titanium is provided between the first and second pole pieces so as to prevent deformation or displacement of the apparatus caused by a magnetic force, as later described. The support member 41 has holes 41A for vacuum evacuation. The support member 41 is electrically insulated from the first pole piece 27 by an insulator 42. The insulators 23, 29, 35, 38 and 42 are made of alumina or the like. The outer wall 36 of the column and the top plate 39 may be made of either of a magnetic material and a non-magnetic material. Here, in this embodiment, they are made of a non-magnetic material.

For example, a voltage of −30 kV is applied to the emitter 21, and −30.3 kV is applied to the suppresser electrode 30, and −25 kV is applied to the second pole piece 28 and the extracting electrode 32. The earth electrode 34 is grounded. As later described, a voltage in the range of between 0 and −26 kV is applied to the lens electrode 23 in accordance with the exciting current supplied to the coil 26. The exciting current of 6,000 to 12,000 AT is supplied to the coil 26. The first pole piece 27, the vacuum seal plate 37, the outer wall 36 of the column and the top plate 39 are grounded. An electron beam 43 is drawn from the distal end of the emitter 21 by an electric field produced between the emitter 21 and the extracting electrode 32. A focusing magnetic field produced by the magnetic lens 25 is disposed in the vicinity of the distal end of the emitter 21. Also, a focusing electric field, produced by the second pole piece 28, the extracting electrode 32, the lens electrode 33 and the earth electrode 34, is disposed between the emitter 21 and the earth electrode 34. Under the influence of the above focusing magnetic field and focusing electric field, the electron beam 43 is focused on a focusing point 45 on an optical axis 44.

Figure 1:
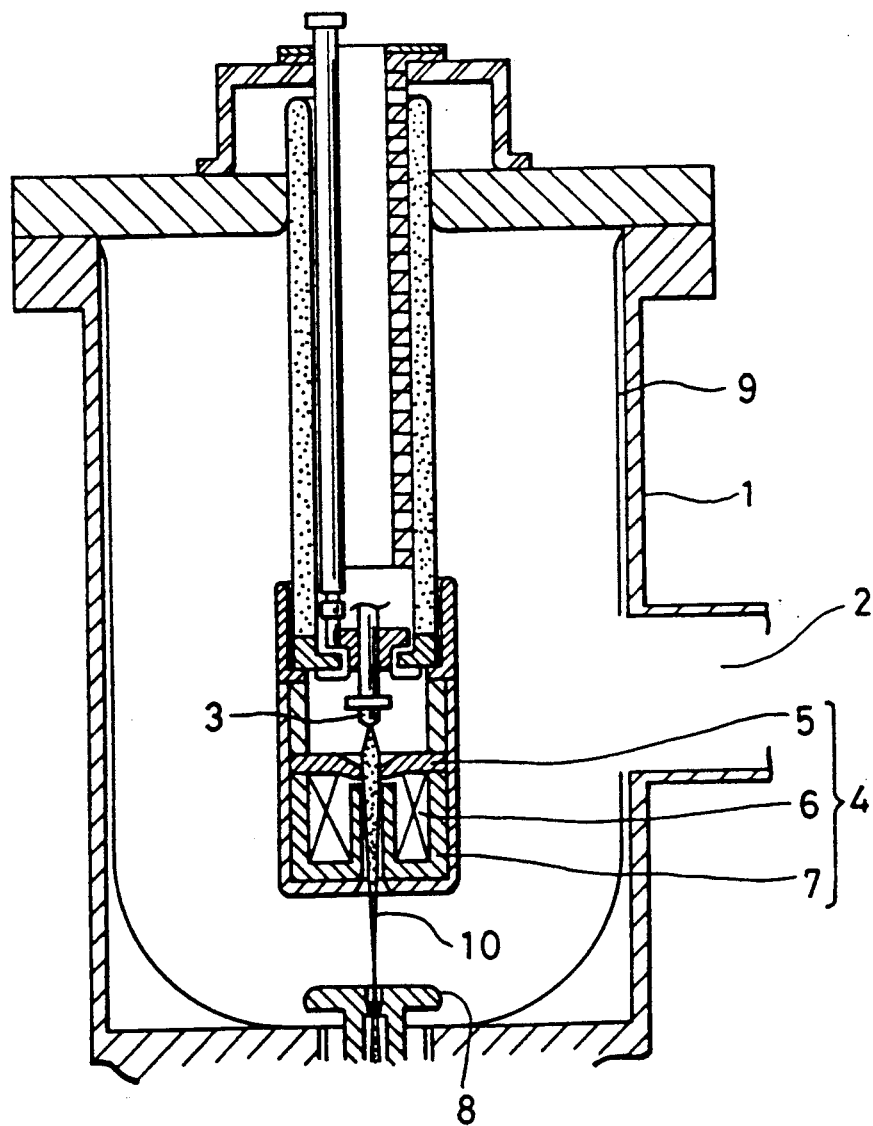
FIG. 1 is a cross-sectional view of a first example of a conventional charged particle beam generating apparatus.

The density of the magnetic flux produced on the optical axis 44 by the magnetic lens 25, as well as the position of the emitter 21 in the magnetic flux density distribution, is shown in FIG. 11 as mentioned above. The value of the magnetic flux density 46 was obtained when the exciting current NI of 1500 AT was caused to flow through the coil 26. In the apparatus of this embodiment, the inner diameter of the first pole piece 27 is greater than the outer diameter of the holder plate 31 for the suppresser electrode 30, and the distal end of the emitter 21 is disposed in a gap formed by the first and second pole pieces 27 and 28 (i.e., the space between the end surfaces 27A and 28A) and is disposed close to the end surface 28A. Further, the inner diameter of the second pole piece 28 is smaller than the inner diameter of the upper portion of the first pole piece 27. With this arrangement, the distal end of the emitter 21 is disposed close to and below the maximum peak 46M of the magnetic flux density, as shown in FIG. 11. Further, by increasing the value of the exciting current of the coil 26 more than 10 times greater than that used in the conventional electron guns, the magnetic flux density 46 is increased. With such arrangement, a lens principal plane 47 is formed immediately below the distal end of the emitter 21, so that the spherical aberration coefficient can be greatly reduced as compared with that achieved with the conventional electron gun. For example, when the exciting current is 11,500 At, the spherical aberration coefficient Cs (referred to the object side) is 0.7 mm, and the chromatic aberration coefficient Cc (referred to the object side) is 1.2 mm. Thus, the spherical aberration coefficient can be reduced to one-third (⅓) of that achieved with the conventional charged particle beam generating apparatus of FIG. 1, without increasing the chromatic aberration coefficient.

In the present invention, in order to reduce the spherical aberration coefficient by reducing the distance between the emitter 21 and the lens principal plane 47, the emitter 21 and the magnetic lens 25 are arranged as described above, and further the inner diameter of the second pole piece 28 is reduced, and a large current is caused to flow through the coil 26. When a large current flows through an ordinary coil, the coil becomes heated, so that gases are emitted from the coil and the pole pieces, which may result in a risk that the degree of vacuum within the electron gun is adversely affected. However, such a risk can be avoided by the following construction. Namely, as shown in FIG. 10, the pole piece is divided into at least two division portions, that is, the first portion 27 enclosing the coil and the second portion 28 disposed close to the optical axis, and the two division portions are electrically insulated from each other. Further, the first division portion enclosing the coil is grounded, and the second division portion disposed close to the optical axis can receive a voltage required for the emission of electrons from the emitter. Since the pole piece is thus of the divided type, the coil and the vacuum chamber within the electron gun can be completely isolated from each other, using O-rings 48, 49, 50 and 51. As a result, the gas emitted from the coil is prevented from flowing into the electron gun. It has been impossible to achieve such prevention when the pole piece and the coil were in an electrically floating condition. Further, since the first pole piece exposed to the atmosphere is grounded, no danger is encountered during the operation, and the construction of the apparatus can be simplified.

Figure 12:
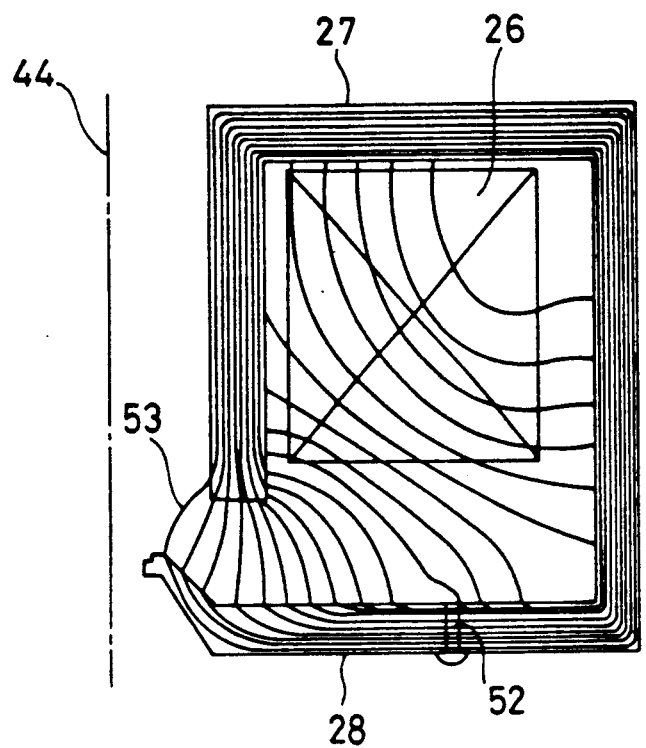
FIG. 12 is an illustration showing lines of magnetic force developing in the vicinity of pole pieces of the apparatus of the present invention.
Figure 13:
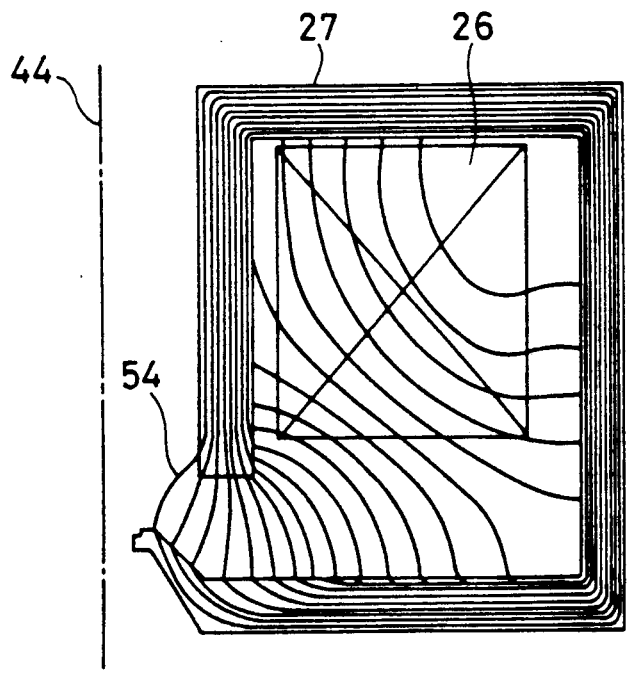
FIG. 13 is a view similar to FIG. 12, but showing a non-divided pole piece.

FIG. 12 shows a distribution of the lines of magnetic force developing in the magnetic lens of this embodiment (which has the pole piece divided into the two parts) in the vicinity of the pole piece. For comparison purposes, FIG. 13 shows a distribution of the lines of magnetic field of a magnetic lens having a non-divided pole piece. Each of these two Figures shows the distribution of the lines of magnetic force in the vicinity of the emitter in a horizontal cross-sectional plane. The distribution of the lines 53 of magnetic force (FIG. 12) in the apparatus of this embodiment is the same as the distribution of the lines 54 of the magnetic force (FIG. 13) of the apparatus having the non-divided pole piece, except for that space disposed in the vicinity of a gap 52. More specifically, the distribution of the magnetic flux density at that region disposed close to the optical axis 44 is substantially the same regardless of whether the pole piece is divided or not. Therefore, the division of the pole piece does not adversely affect the beam focusing characteristics. If the length of the gap 52 is about 1/5 or less of the thickness of the first pole piece 27 (and hence the second pole piece 28), the exciting current for the coil 26 can be controlled to a value about 8% greater than that used in the apparatus having the non-divided pole piece. Preferably, the gap 52 is so positioned that the surface density of the magnetic flux passing across the gap can be small, and also that all those portions of the pole piece exposed to the atmosphere are kept at the ground potential. Preferably, the length of the gap 52 is short in so far as the first and second pole pieces are insulated from each other. It is also preferred that the pole piece is divided into more than two so as to reduce the required voltage resistance of each of such separate pole pieces. The insulator made, for example, of alumina is used for insulation between the pole pieces. However, it is possible that the pole pieces are merely fixed in spaced relation to each other, and a gap between the spaced pole pieces is used as a vacuum space for insulating purposes. The electric field is applied to the extracting electrode 32 via the second pole piece 28. In the case where the pole piece is divided into more than two, the electric field is, of course, applied to the extracting electrode 32 via the innermost pole piece. Thus, in the magnetic lens 25, the pole piece can be divided into two or more without increasing the exciting current for the coil 26. Therefore, the first pole piece 27 can be grounded, and a vacuum seal can be provided between the first pole piece 27 and the vacuum seal plate 37. As a result, the gas emitted from the coil 26 is prevented from flowing into the electron gun, and it becomes possible to flow a large current of 10,000 AT or more through the coil 26.

To divide the pole piece and to put those portions of the pole piece exposed to the atmosphere at the ground potential are advantageous from the viewpoints of the operation safety and the simplicity of the construction even in the conventional apparatus in which the emitter is disposed above the magnetic lens.

Figure 14:
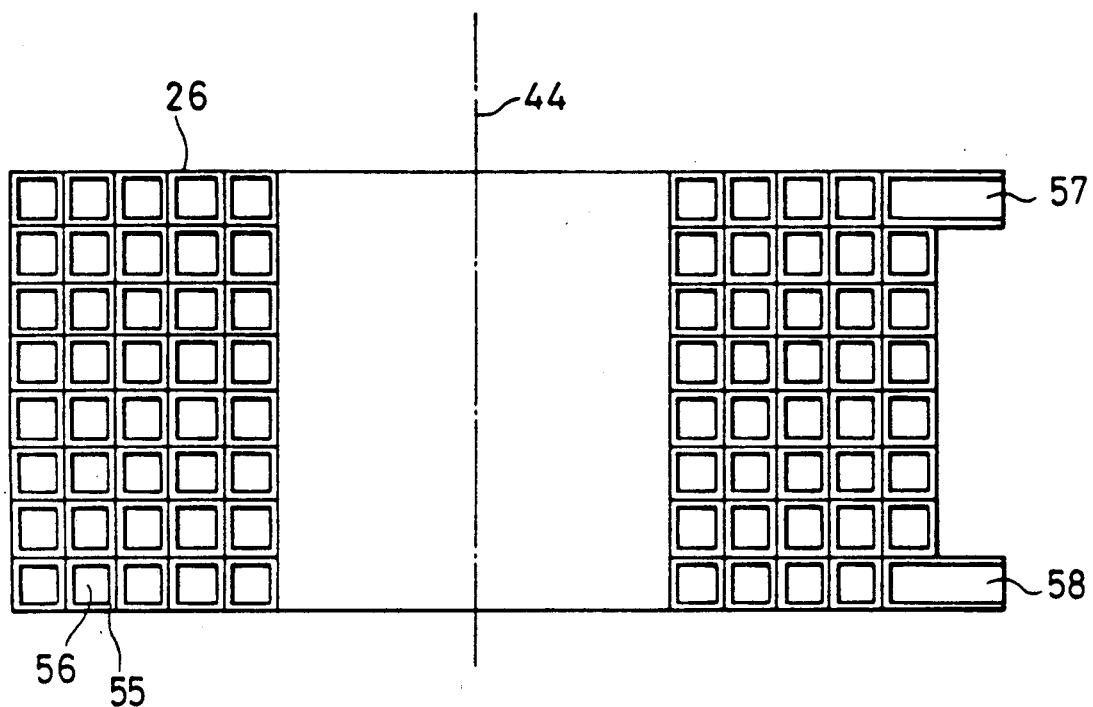
FIG. 14 is a cross-sectional view of a coil of the apparatus of the present invention.

FIG. 14 shows the cross-section of the coil 26. The coil 26 is made of a copper pipe 55 having an internal bore 56. Cooling water is supplied to a water supply port 57 of the copper pipe, and is passed through the internal bore 56, and then is discharged from a water discharge port 58 of the copper pipe. The heat generated by the copper pipe 55 is removed from the pipe 55 via the cooling water passing through the pipe 55. Therefore, the temperature of the coil 26 hardly rises. For example, when the exciting current of 12,000 AT is caused to flow through the coil 26, a temperature rise of the coil 26 is not more than 10° C. Therefore, the exciting current of a value more than ten times greater than that used in the conventional electron gun can be supplied to the coil 26. The pole piece is of the above-mentioned construction, and in addition the coil is made of the copper pipe so that the cooling water can be caused to flow through the copper pipe. With these arrangements, a strong magnetic field required for focusing the beam can be produced. The coil 26 can, of course, be made of other electrically and thermally conductive material than copper, such as aluminum. Also, the cooling medium can, of course, be other material than water, such as liquid nitrogen.

Figure 15:
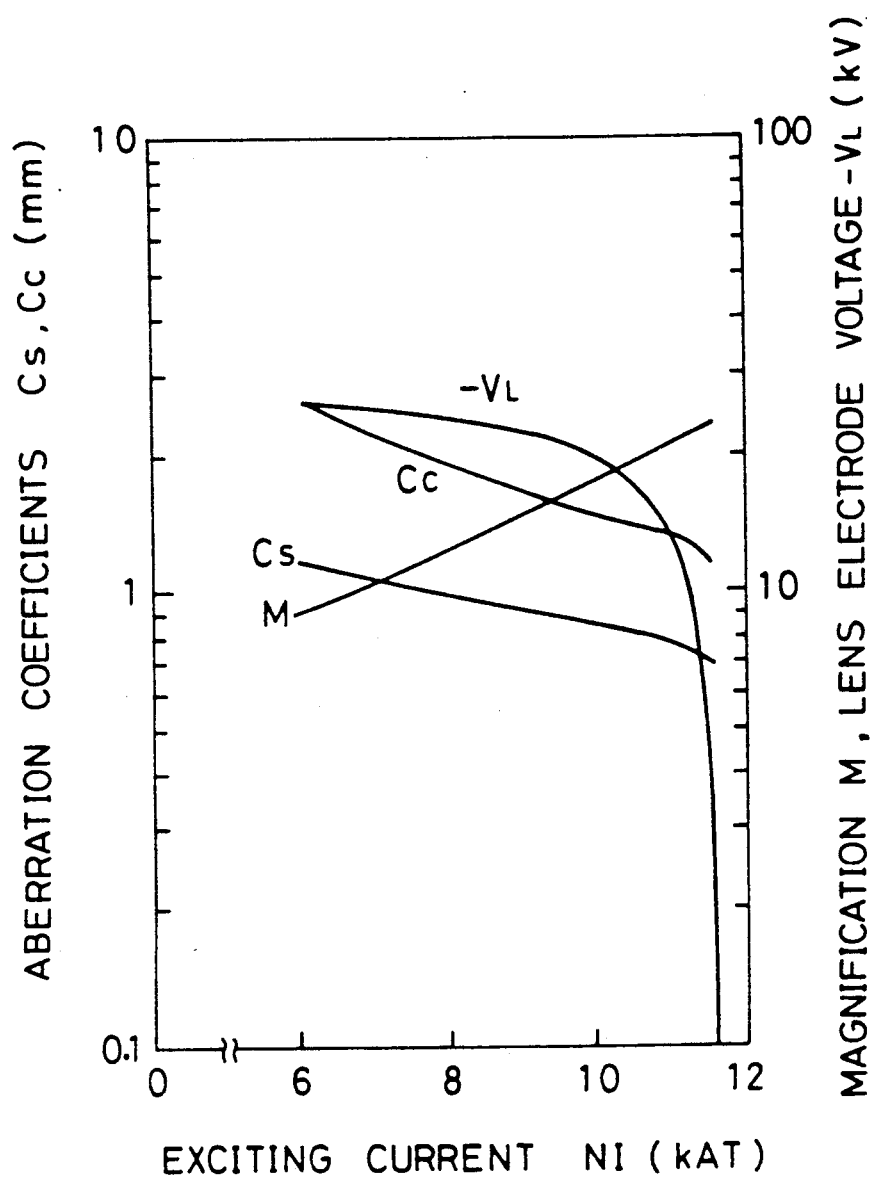
FIG. 15 is an illustration showing the dependency of the spherical aberration coefficient Cs, the chromatic aberration coefficient Cc, the magnification M and lens electrode voltage $V_L$ on the exciting current in the apparatus of the present invention.

In the apparatus of this embodiment, an electrostatic lens for focusing the electron beam 43 is constituted by the electrode composed of the second pole piece 28 and the extracting electrode 32, the lens electrode 33, and the earth electrode 34. In this construction, usually, the magnetic lens 25 performs the beam focusing function, and the above electrostatic lens only performs the function of adjusting the position of the focusing point of the beam. However, when it is desired to achieve a zoom lens with this construction, the power of the above electrostatic lens is adjusted in accordance with the power of the magnetic lens 25, so that the magnification M of the lens, the spherical aberration coefficient Cs, and the chromatic aberration coefficient Cc can be varied without varying the position of the focusing point 45 of the electron beam 43. Namely, in the apparatus of this embodiment, the zoom lens is achieved by the combination of the above electrostatic lens and the magnetic lens 25. FIG. 15 shows the magnification M of the zoom lens, the spherical aberration coefficient Cs, the chromatic aberration coefficient Cc, and the lens electrode voltage $V_L$, obtained when the exciting current NI is set to a predetermined value, and the voltage $V_L$ of the lens electrode 33 is so adjusted that the focusing point 45 can be fixed. When the exciting current NI is in the range of 6,000 to 11,500 AT, the spherical aberration coefficient varies about twice. As can be seen from the formula (2), when the beam emission angle s is large, the radius r of the beam emitting source is proportional to the spherical aberration coefficient Cs. Therefore, in the apparatus of this embodiment, the radius r of the beam emitting source can be controlled by the exciting current NI, while keeping the position of the beam focusing point 45 fixed. As a result, the brightness B and the emittance 2s·r of the electron gun can be controlled without changing the position of the beam focusing point 45. This can increase the degree of freedom in construction of an electron-optic system (an objective lens or the like) to which the apparatus of this embodiment is to be connected.

Figure 16:
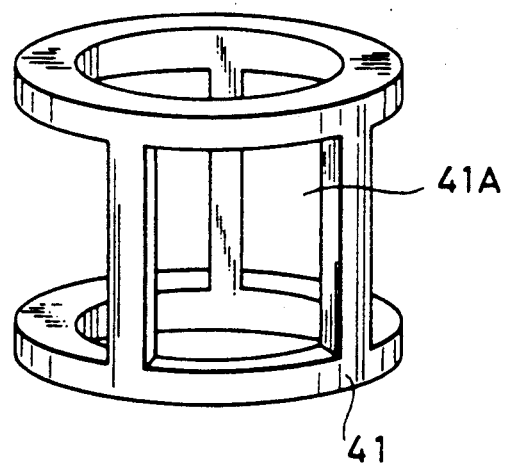
FIG. 16 is a perspective view of a support member of the apparatus of the present invention.

In the apparatus of this embodiment, since the exciting current of about 10,000 AT is caused to flow through the coil 26, a magnetic attractive force of about 300 kg is exerted between the end surface 27A of the first pole piece 27 and the upper end surface 28A of the second pole piece 28. In order to prevent this force from deforming or displacing the apparatus, the support member 41 of a non-magnetic material is provided between the first pole piece 27 and the second pole piece 28. One example of the support member 41 is shown in FIG. 16. The support member 41 has a cylindrical shape having an axis or centerline aligned with the optical axis 44. The holes 41A for vacuum evacuation are formed through its side wall. That region in the vicinity of the emitter 21 can be evacuated to vacuum through the hole 41A and the evacuation pot 40. In the apparatus of this embodiment, with this construction, the pole pieces are not destroyed even when the exciting current of a high magnitude is supplied, and also the portion in the vicinity of the emitter can be evacuated to a ultra high vacuum. The support member 41 may have any other suitable shape than the cylindrical shape, such as a tube of a polygonal cross-section. Also, the shape of the hole 41A is not limited to a square shape shown in FIG. 16, and the number of the holes 41A is not limited to three shown in FIG. 16. Further, instead of using such one tubular support member having the holes, more than two tubular members may be provided between the first and second pole pieces so as to resist the above magnetic force.

Figure 17:
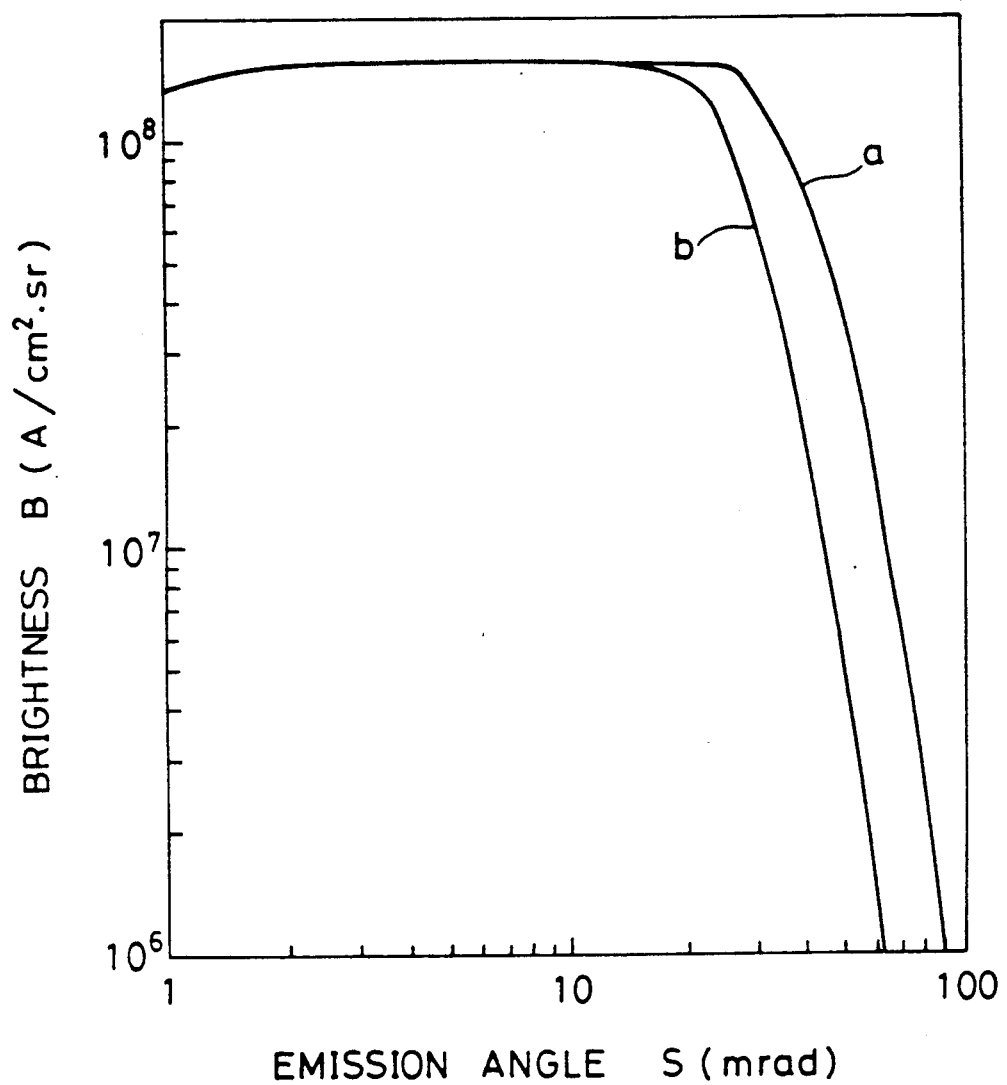
FIG. 17 is an illustration showing a comparison in brightness characteristics between the apparatus of the present invention and the prior art.

A curve a in FIG. 17 represents the relation between the beam emission angle s and the brightness B in the apparatus of this embodiment shown in FIG. 10. Here, the accelerating voltage Va of the electron beam is 30 kV, and the beam energy spread V is 0.8 eV, and the angular intensity I' is 0.5 mA/sr, and the radius ro of the beam emitting source obtained when the aberrations are disregarded is 0.01 μm. A curve b represents the characteristics of the conventional apparatus of FIG. 1 under the same conditions. At the emission angle s of 35 mrad, the brightness B of the apparatus of the present invention is three times greater than that of the conventional apparatus, and at the emission angle s of not less than 50 mrad, the brightness B is 6 to 7 times greater.

Figure 18:
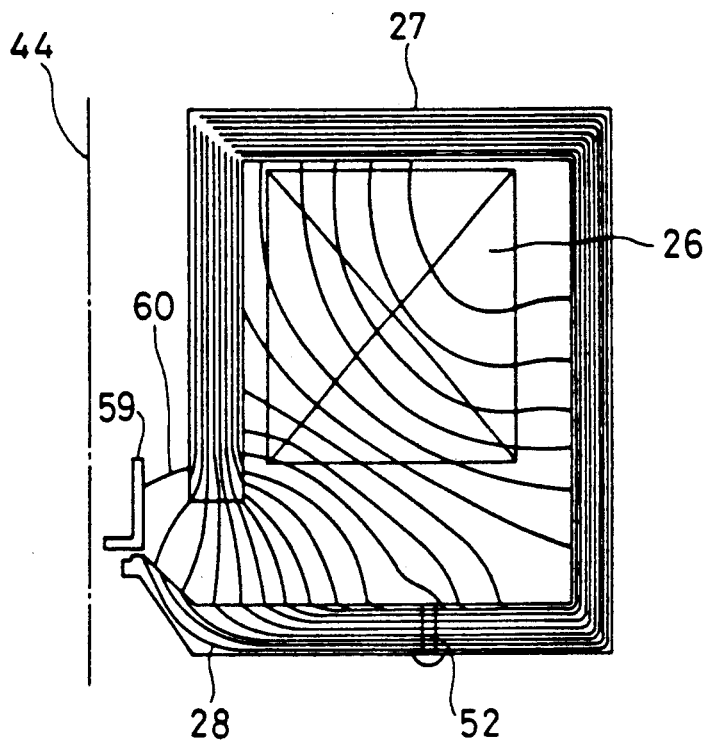
FIG. 18 is a cross-sectional view of a portion of a modified apparatus of the present invention.

FIG. 18 shows a distribution of a magnetic flux in another embodiment of a charged particle beam generating apparatus of the present invention. In this embodiment, a suppresser electrode 59 is made of a magnetic material. Only a magnetic lens and the suppresser electrode are shown in FIG. 18, and the other component parts are omitted. Since the suppresser electrode 59 is made of a magnetic material the magnetic flux 60 extends to the suppresser electrode 59. Therefore, a magnetic potential gradient develops in the vicinity of the emitter surrounded by the suppresser electrode 59. By suitably determining the shape of the suppresser electrode 59, the magnetic potential gradient can be controlled, so that the aberration coefficient can be further reduced, and the current flowing through the coil 26 can be decreased. At least part of the holder plate 31 (shown in FIG. 10) for the suppresser electrode can be made of a magnetic material so as to control the magnetic field gradient.

Although the present invention has been described with respect to the case where the beam of charged particles emitted from the emitter is an electron beam, the present invention is applicable to other oases, for example, where the charged particles are gallium ions. Also, the present invention is achieved when there is used any other suitable tip than the zirconium/tungsten thermal-field-emission type tip, such as a tungsten field-emission type tip and a lanthanum hexaboride thermal-emission type tip. Further, the present invention is achieved when instead of the normal conducting magnetic lens, a superconducting lens is used as the magnetic lens. Further, if as the method of reducing the amount of the gas emitted from the coil, there is used either the method of vacuum-sealing the coil or the method in which the cooling water is caused to flow through the conductive pipe forming the coil, the present invention is achieved when the coil is made of a superconducting material so as to restrain the generation of heat from the coil, or when a pipe independent of the coil is provided around or within the coil, and cooling water is caused to flow through this pipe so as to restrain the generation of heat from the coil.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A charged particle beam generating apparatus comprising:
    an emitter for emitting a beam of charged particles, and
    a magnetic lens including a coil, and a pole piece constituting a magnetic path;
    a distal end of said emitter being disposed at a level below a peak of a distribution of a magnetic flux density formed by said magnetic lens, wherein said coil is annular, there being provided a holder member for holding said emitter, an inner diameter of an upper portion of said pole piece being greater than said holder member, and an inner diameter of a lower portion of said pole piece being smaller than the inner diameter of said upper portion of said pole piece.

2. Apparatus claimed in claim 1, wherein said pole piece is divided into at least two division portions electrically insulated from each other.

3. Apparatus claimed in claim 2, wherein there is provided an electrostatic lens for controlling the position of a focusing point of said beam, said electrostatic lens comprising at least one of said division portions of said pole piece, and at least one electrode.

4. Apparatus claimed in claim 3, wherein said coil comprises a pipe of an electrically and thermally conductive material, and means for flowing a cooling medium through said pipe.

5. Apparatus claimed in claim 1, wherein said coil comprises a pipe of an electrically and thermally conductive material, and means for flowing a cooling medium through said pipe.

6. A charged particle beam generating apparatus comprising:
    an emitter for emitting a beam of charged particles, and
    a magnetic lens including a coil, and a pole piece constituting a magnetic path;
    a distal end of said emitter being disposed at a level below a peak of a distribution of a magnetic flux density formed by said magnetic lens, wherein said pole piece is divided into at least two division portions electrically insulated from each other.

7. Apparatus claimed in claim 6, wherein there is provided an electrostatic lens for controlling the position of a focusing point of said beam, said electrostatic lens comprising at least one of said division portions of said pole piece, and at least one electrode.

8. Apparatus claimed in claim 6, wherein said coil comprises a pipe of an electrically and thermally conductive material, and means for flowing a cooling medium through said pipe.

9. A charged particle beam generating apparatus comprising:
    an emitter for emitting a beam of charged particles;
    a magnetic lens including a coil, and a pole piece constituting a magnetic path, said coil being annular;
    a holder member for holding said emitter;
    an inner diameter of an upper portion of said pole piece being greater than said holder member, an inner diameter of a lower portion of said pole piece being smaller than the inner diameter of said upper portion of said pole piece;
    said pole piece having a pair of upper and lower end surfaces, said emitter being disposed in a space formed between said upper and lower end surfaces and being disposed close to said lower end surface.

10. Apparatus claimed in claim 9, wherein said pole piece is divided into at least two division portions electrically insulated from each other.

11. Apparatus claimed in claim 10, wherein there is provided an electrostatic lens for controlling the position of a focusing point of said beam, said electrostatic lens comprising at least one of said division portions of said pole piece, and at least one electrode.

12. Apparatus claimed in claim 11, wherein said coil comprises a pipe or an electrically and thermally conductive material, and means for flowing a cooling medium through said pipe.

13. Apparatus claimed in claim 10, wherein said coil comprises a pipe of an electrically and thermally conductive material, and means for flowing a cooling medium through said pipe.

14. Apparatus claimed in claim 9, wherein said coil comprises a pipe of an electrically and thermally conductive material, and means for flowing a cooling medium through said pipe.

* * * * *